United States Patent
Satoh

(10) Patent No.: US 6,448,689 B2
(45) Date of Patent: Sep. 10, 2002

(54) PIEZOELECTRIC OSCILLATOR

(75) Inventor: Tomio Satoh, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 0 days.

(21) Appl. No.: 09/827,809

(22) Filed: Apr. 6, 2001

(30) Foreign Application Priority Data

Apr. 21, 2000 (JP) .................................. 2000-121527

(51) Int. Cl.[7] ............................................... H01L 41/08
(52) U.S. Cl. ................................................ 310/316.01
(58) Field of Search ........................ 310/316.01, 317, 310/319

(56) References Cited

U.S. PATENT DOCUMENTS

| | | | |
|---|---|---|---|
| 3,629,726 A | * 12/1971 | Popescu | 310/316.01 |
| 4,277,710 A | * 7/1981 | Harwood et al. | 310/316.01 |
| 4,578,650 A | * 3/1986 | Watson | 331/160 |
| 5,113,116 A | * 5/1992 | Wilson | 310/316.01 |
| 5,216,338 A | * 6/1993 | Wilson | 318/116 |

* cited by examiner

Primary Examiner—Mark O. Budd
(74) Attorney, Agent, or Firm—Koda & Androlia

(57) ABSTRACT

The piezoelectric oscillator is a Colpitts circuit including a piezoelectric vibrator and a load capacitance in the oscillating loop and a limiter circuit. The excitation signal from the piezoelectic vibrator is supplied to the limiter circuit, and the limiter circuit controls the inter-terminal impedance of the capacitor which is connected to the limiter based on variations in the excitation signal and thus clips the level of the excitation signal.

14 Claims, 4 Drawing Sheets

PIEZOELECTRIC OSCILLATOR

TECHNICAL FIELD

The present invention relates to a piezoelectric oscillation circuit; in particular, to an inexpensive piezoelectric oscillation circuit that has excellent aging characteristics.

PRIOR ART

Crystal oscillators that have excellent frequency stability (hereafter referred to as "aging characteristics") despite years of changes generally comprise an AGC circuit such as that shown in FIG. 4 in order to operate a crystal vibrator at low excitation levels, to restrain the driving stress exerted upon on a crystal vibrator.

FIG. 4 is a circuit diagram of a crystal oscillator comprising a conventional AGC circuit.

In crystal oscillator 100 shown in the figure, output from an oscillation circuit 101 enclosed by a broken line is supplied to a buffer circuit 103 in the next stage via a capacitor 102; output from buffer circuit 103 is applied to an AGC circuit 104 enclosed by -a broken line; and a signal at an anode of a diode 116 which corresponds to an output from AGC circuit 104 is returned to oscillation circuit 101.

Oscillation circuit 101 is of a general Colpitts type: a crystal vibrator 106 with one end grounded via a capacitor 105 has the other end connected to a base of a transistor 107, a series circuit composed of capacitors 108 and 109 as well as a resistor 110 are connected between the base and the ground, and a connection midpoint of the series circuit composed of capacitors 108 and 109 is connected to an emitter of transistor 107, the emitter being grounded via a resistor 111.

The base of transistor 107 is connected to the output of AGC circuit 104 via a resistor 112, and a collector of transistor 107 is connected to a power supply Vcc via a resistor 113.

The AGC circuit 104 is comprised of resistors 114, 120, 121, 122, capacitors 115, 118, 119, diodes 116 and 117. A cathode end of the diode 116 and an anode end of the diode 117 connect to an output end of buffer circuit 103 via a series circuit of resistor 114 and capacitor 115. The other ends of the diodes are grounded via capacitor 118 and 119, respectively and are connected together via a resistor 120. The anode end of diode 116 is connected to the base of transistor 107 via resistor 112 included in oscillation circuit 101. Additionally, a series circuit composed of resistors 121 and 122 is connected between the power supply Vcc and the ground and has its connection midpoint connected to a cathode of diode 117.

Buffer circuit 103 is connected to an output of the oscillator via a series circuit composed of a resistor 123 and a capacitor 124.

The operation of the crystal oscillator will be described below. The oscillation circuit 101 is of the general Colpitts type; since the particulars of this circuit are well known, a description is omitted.

When an excitation signal output from oscillation circuit 101 is applied to AGC circuit 104 via buffer 103, a plus half cycle of the signal is directed to the ground via diode 117, and a minus half cycle of the signal is directed to the ground via diode 116. Accordingly, a current A is generated between terminals of resistor 120 due to the occurrence of such a voltage that provides a low voltage at the terminal connected to diode 116.

In addition to current A, a current B determined on the basis of a voltage generated at a connection midpoint between resistor 121 and resistor 122 is supplied to resistor 120. As a result, a total current obtained by subtracting current B from current A is supplied to a base current flowing through transistor 107, and the base current determined by the total current causes the crystal vibrator 106 to generate an excitation signal of a desired fixed level.

In the above operational state, if the level of the excitation signal from crystal vibrator 106 increases, the level of the excitation signal supplied to AGC circuit 104 increases and the voltage across resistor 120 rises to increase the value of current A, thereby reducing the total current (current B—current A) and the base current of transistor 107.

The decrease in the base current of transistor 107 reduces the gain of transistor 107, reducing the output level (the collector output level of transistor 107) of oscillation circuit 101 and thus reducing the emitter voltage (AC component) level of transistor 107. Consequently, the level of a signal generated between the terminals of capacitor 109 falls, reducing the level of the excitation signal from crystal vibrator 106.

If the level of the excitation signal from crystal vibrator 106 increases, then an operation that is the reverse of the above-described operation occurs. A description of this operation is omitted.

The above operation is repeated to have the level of the excitation signal from the crystal vibrator 106 being stable to the desired value.

However, since the electronic parts (including the crystal vibrator) constituting the oscillation circuit and AGC circuit have varying characteristics, the circuit must be configured to obtain a low and desired excitation level—that is, an optimal excitation level—taking into account the characteristics of the individual parts. This prevents cost-efficient production of the crystal oscillator.

SUMMARY OF THE INVENTION

It is an object of the present invention to solve the above problems to provide an inexpensive crystal oscillator having excellent aging characteristics.

To resolve this problem, the present invention provides a piezoelectric oscillator comprising a Colpitts circuit including a piezoelectric vibrator and a load capacitance comprising at least a capacitor in the oscillating loop, and a limiter circuit, wherein an excitation signal from the piezoelectric vibrator is supplied to the limiter circuit. Based on variations in excitation signal, the limiter At controls an inter-terminal impedance of said capacitor which is connected to said limiter and thus clips (the sill level outside the range of a fixed is eliminated) the level of the excitation signal.

In this configuration, the limiter circuit comprises a series circuit comprising two diodes connected in series so that a forward current of the diodes flows from a power supply toward a ground, and a capacitor connected in parallel win the series circuit, with a connection midpoint between the two diodes connected to one end of the capacitor.

Moreover, the capacitor is inserted and connected between the piezoelectric vibrator and the ground; the capacitor includes two divided capacitors connected in series; the limiter circuit comprises a series circuit comprising two diodes connected in series so that a forward current of the diodes flows from a power supply toward a ground; and a capacitor connected in parallel with the series circuit, and a connection midpoint between the two divided capacitors and a connection midpoint between the two diodes are connected together via a capacitor.

Moreover, the present invention provides a Colpitts circuit comprising a transistor circuit having a resistance element connected to an appropriately biased emitter, a piezoelectric vibrator inserted between a base and a ground of he transistor circuit, and two divided capacitors, one of which is connected between the base and emitter of the transistor, with the other connected in parallel with the emitter resistor, wherein a resistor of a desired value and two diodes are inserted in series between a power supply and the ground, the Colpitts circuit includes a capacitor for earthing the diode series circuit toward a high frequency, and the two diode connection points and the emitter of the transistor are connected to obtain an alternate current.

EMBODIMENTS OF THE INVENTION

The present invention is described below in detail with reference to illustrated embodiments.

Figure 1:
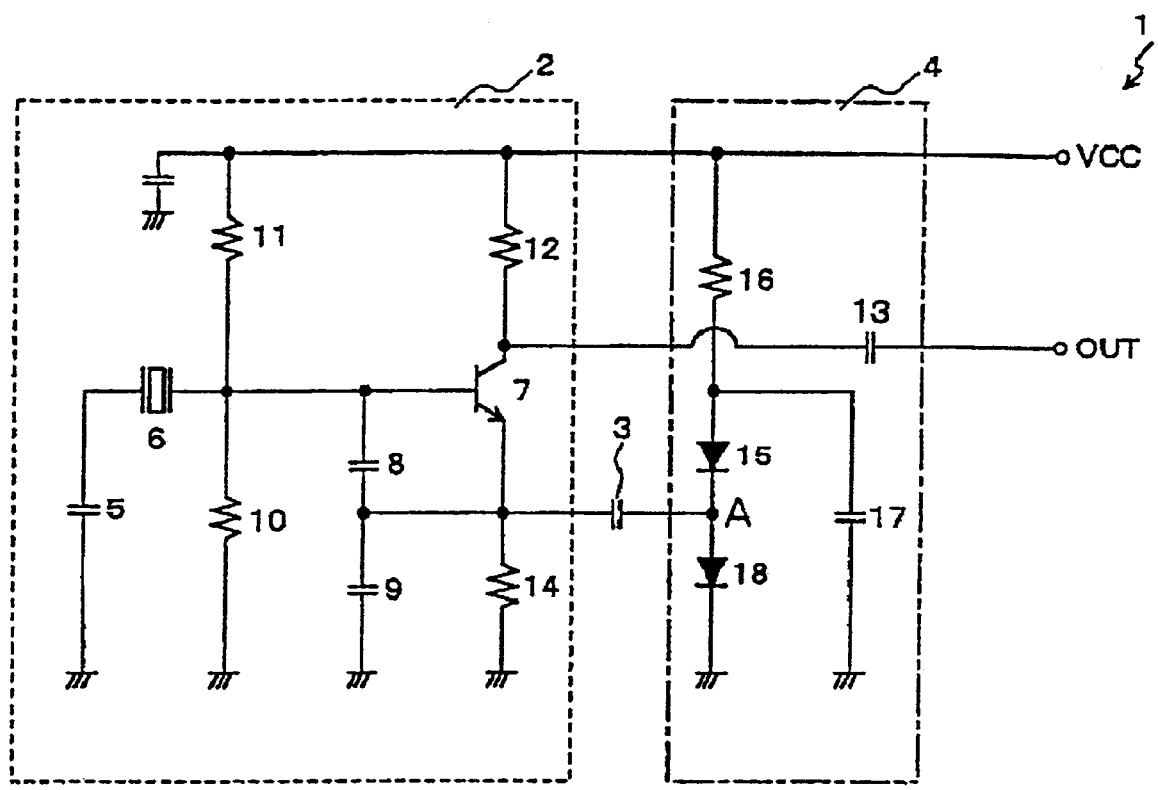
FIG. 1 is a circuit diagram of one embodiment of a crystal oscillator according to the present invention.

FIG. 1 is a circuit diagram of one embodiment of a crystal oscillator according to the present invention. In a crystal oscillator 1, shown in FIG. 1, an output of an oscillating loop of an oscillation circuit 2 enclosed by a dot line is connected via capacitor 3 to a limiter circuit 4, enclosed by an alternate long and short dashed lines.

Oscillation circuit 2 comprises a general Colpitts oscillation circuit; a crustal vibrator 6 having one end grounded has the other end connected to a base of a t or 7, a capacitor 8 constituting part of a load capacity is connected between the base and an emitter of transistor 7, a parallel circuit of a capacitor 9 and a resistor 14 is inserted and connected between the emitter and a ground and a resistor 12 is connected between a collector and a power supply Vcc. A voltage obtained by resistors 10 and 11 by dividing the power supply Vcc is applied to the base of transistor 7.

The limiter circuit 4 is comprised of resistors 16, capacitor 17, and diodes 116 and 117. A cathode end of the diode 15 connects the power supply VCC via resistor 16, and the ground via capacitor 17. Diode 18 is provided between the cathode end of diode 15 and the ground so that a forward current of diode 18 flows from diode 15 to the ground. The cathode end of diode 15 connects to the emitter of transistor 7 via capacitor 3.

Crystal oscillator 1 in this configuration is characterized in that the power supply Vcc is applied to the series circuit of diodes 15 and 18 via resistor 16 to set a cathode end A of diode 15 at a predetermined voltage, and an output from oscillation circuit 2 is applied to cathode end A of diode 15 via capacitor 3. Amplification of the transistor is restrained to maintain the level of an excitation signal at a desired value, based on the characteristic of the diode that the impedance thereof decreases rapidly when the amplitude value of an applied output signal from the oscillation circuit is equal to or larger than a specified value.

This will be specifically described in conjunction with some operations and settings of element values.

Figure 2:
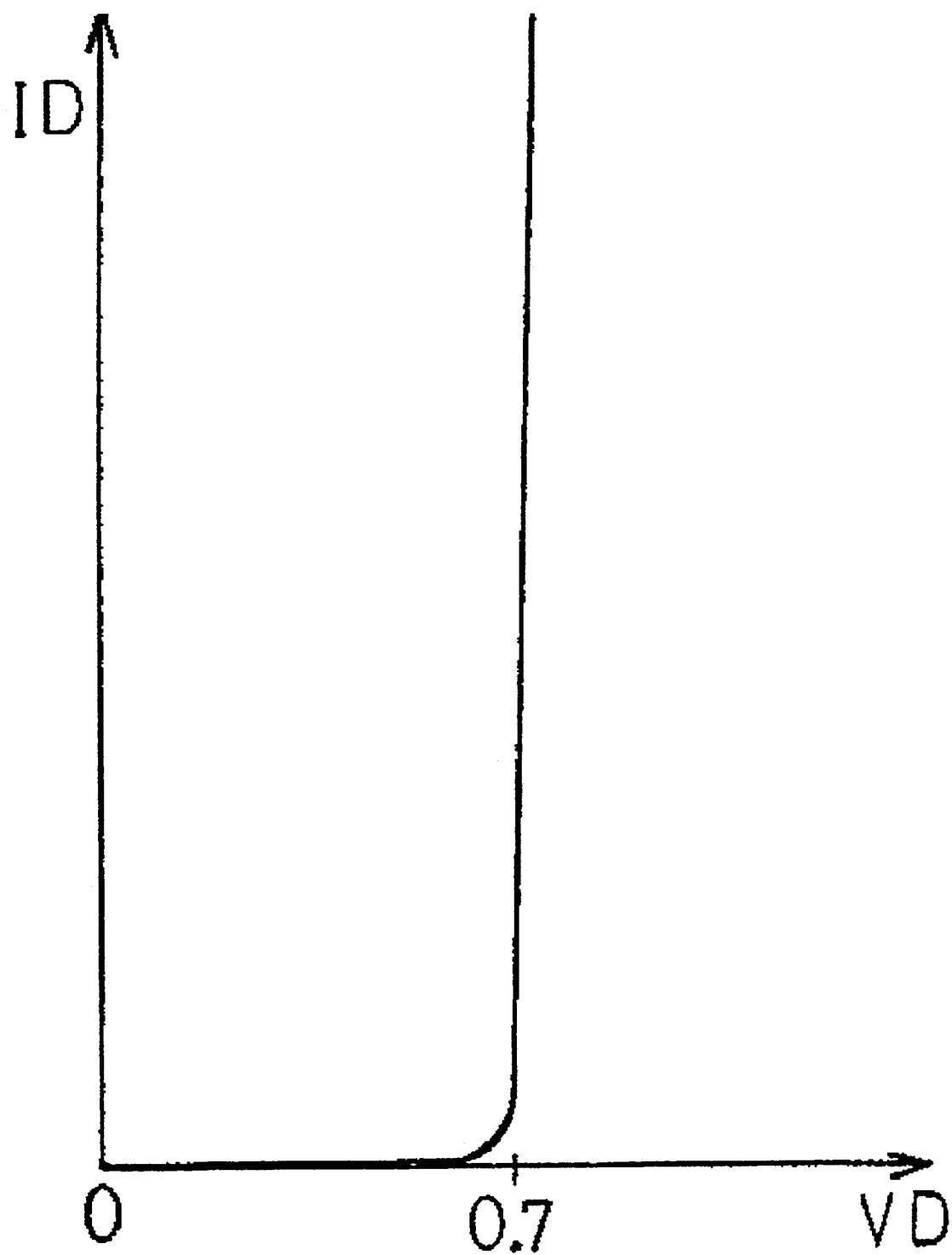
FIG. 2 is a view showing the relationship between an inter-terminal voltage and a forward current of a diode.

FIG. 2 shows the relationship between an inter-terminal forward voltage VD and an inter-terminal forward current ID. As the figure clearly shows, the diode is generally characterized in that when the forward voltage VD is less than 0.7 V, the forward current is prevented from flowing to provide a high inter-terminal impedance; and in that once the forward voltage has reached 0.7 V, the inter-terminal impedance decreases to cause the forward current to flow, thereby preventing the inter-terminal voltage VD from rising above 0.7V.

For example, in crystal oscillator 1 configured as shown in FIG. 1, resistor 16 is set at 40 k$\Omega$, power supply voltage Vcc is set at 5V, and a DC $\alpha$ flowing from the power supply Vcc to the ground via resistor 16 and diodes 15 and 18 is set at 0.1 mA.

A DC voltage of 0.4V is generated between the ground and the connection midpoint A between diodes 15 and 18. Additionally, a DC voltage of 0.8V is generated between an anode of diode 15 and the ground.

In the above case, both diodes have high impedance between their terminals, because their inter-terminal voltage VD is 0.7V or less, as shown in FIG. 2, and a high impedance is correspondingly present between the connection midpoint A in limiter circuit 4 and the ground. Accordingly, the impedance between the terminals of capacitor 9 of oscillation circuit 2 is largely determined by the value for capacitor 9, and unaffected by the impedance based on the diodes.

For example, after limiter circuit 4 has been set as described above, an excitation signal Vs=0.4VP-P (half cycle ±0.2V) is supplied to the connection midpoint A via capacitor 3 according to oscillation conditions for the oscillation circuit 2. Then, the excitation signal is superposed on the DC voltage so that the voltage at the connection midpoint A varies between 0.2V and 0.6V consistently with variations in the amplitude of the excitation signal.

As shown in FIG. 2, when the inter-terminal voltage VD of diodes 15 and 18 is between 0.2 V and 0.6 V, the forward current is prevented from flowing between the terminals of each of the terminals, thereby maintaining a high impedance between the connection midpoint A and the ground and permitting the inter-terminal impedance of capacitor 9 to be determined by the value for capacitor 9 without being affected by the diodes. As a result, crystal oscillator 1 outputs an excitation signal of amplitude Vs=0.4VP-P oscillated based on oscillation conditions for oscillation circuit 2.

Next, it is assumed that in the above state, the level of the excitation signal rises to 0.8VP-P (half cycle±0.4V).

When the plus half cycle of the excitation signal (0.4V) is supplied to the connection midpoint A via capacitor 3, a voltage corresponding to the superposition of the plus half cycle voltage on a bias voltage from the power supply voltage Vcc and which varies between 0.4V and 0.8V is generated at connection midpoint A.

Since 0.8V DC is generated at the anode end of diode 15 by means of power supply Vcc, as described above, the inter-terminal voltage VD of diode 15 varies between 0.4V and 0V, thus maintaining high impedance between the terminals of diode 15.

The inter-terminal voltage VD of diode 18 varies between 0V and 0.8V consistently with variations in the voltage at connection midpoint A. However, as described with reference to FIG. 2, when VD>0.7V, the inter-terminal impedance decreases to generate a forward current, thereby causing the inter-terminal voltage VD to vary between 0V and 0.7V.

On the other hand, if a minus half cycle of the excitation signal (−0.4V) is supplied to the connection midpoint, the minus half cycle voltage between 0V and −0.4V is superposed on the power supply voltage Vcc of 0.4V at the connection midpoint, generating a voltage varying between 0 and 0.4V. In this case, since the inter-terminal voltage VD of the diode 18 is equal to the voltage between connection midpoint A and the ground and VD=0.7V or less, when VD>0.7V, the inter-terminal impedance decreases to generate a forward current, thereby causing inter-terminal voltage VD to vary between 0V and 0.7V, as described with reference to FIG. 2.

Thus, inter-terminal voltage VD (the voltage between the connection midpoint A and the ground) is kept at less than 0.7V over the entire cycle of the excitation signal, so that the inter-terminal voltage of capacitor 9 does not rise past 0.7V. This prevents. the level Vs of the excitation signal from increasing, and maintains it at 0.4VP-P or less. Additionally, the excitation signal is kept at a low fixed value if its lowest level upon driving is Vs=0.4VP-P.

That is, since the oscillating loop gain of a Colpitts oscillation circuit depends on voltages at the opposite ends of capacitors 8 and 9, restricting the voltages at the opposite ends of capacitor 9 corresponds to a restriction on the oscillating loop gain.

When the above operation maintains the oscillating loop gain at a fixed value, crystal vibrator 6 is able to maintain a low desired level for excitation.

Crystal oscillator 1 according to the present invention thus minimizes the driving stress of crystal vibrator 2, and thus has excellent aging characteristics. An AGC circuit is conventionally used to control the driving stress of the crystal vibrator, but since electronic parts constituting the AGC circuit and the oscillation circuit have varying characteristics, the oscillation circuit and the AGC circuit must be configured to obtain an optimal excitation level, taking the characteristics of the individual parts into consideration. In contrast, a crystal oscillator according to the present invention uses the characteristics of the diodes to control amplification of the transistors of the oscillation circuit, so that the optimal excitation level can be adjusted simply by means of the value for resistor 16 of the limiter circuit, thus enabling efficient production.

In the above description, the level Vs of the excitation signal is set to 0.4VP-P, but the present invention is not limited to this value. The bias at the connection midpoint A which is initially set for the limiter circuit 4 by means of power supply voltage Vcc may be set higher to keep the level of the excitation signal lower than 0.4VP-P. Further, to set the level of the excitation signal higher than 0.4VP-P, the level of the excitation signal supplied to limiter circuit 4 by oscillation circuit 2 may be set high in advance so that the bias at connection midpoint A provided by power supply voltage Vcc can be set low enough to accommodate the set level of the excitation signal.

Figure 3:
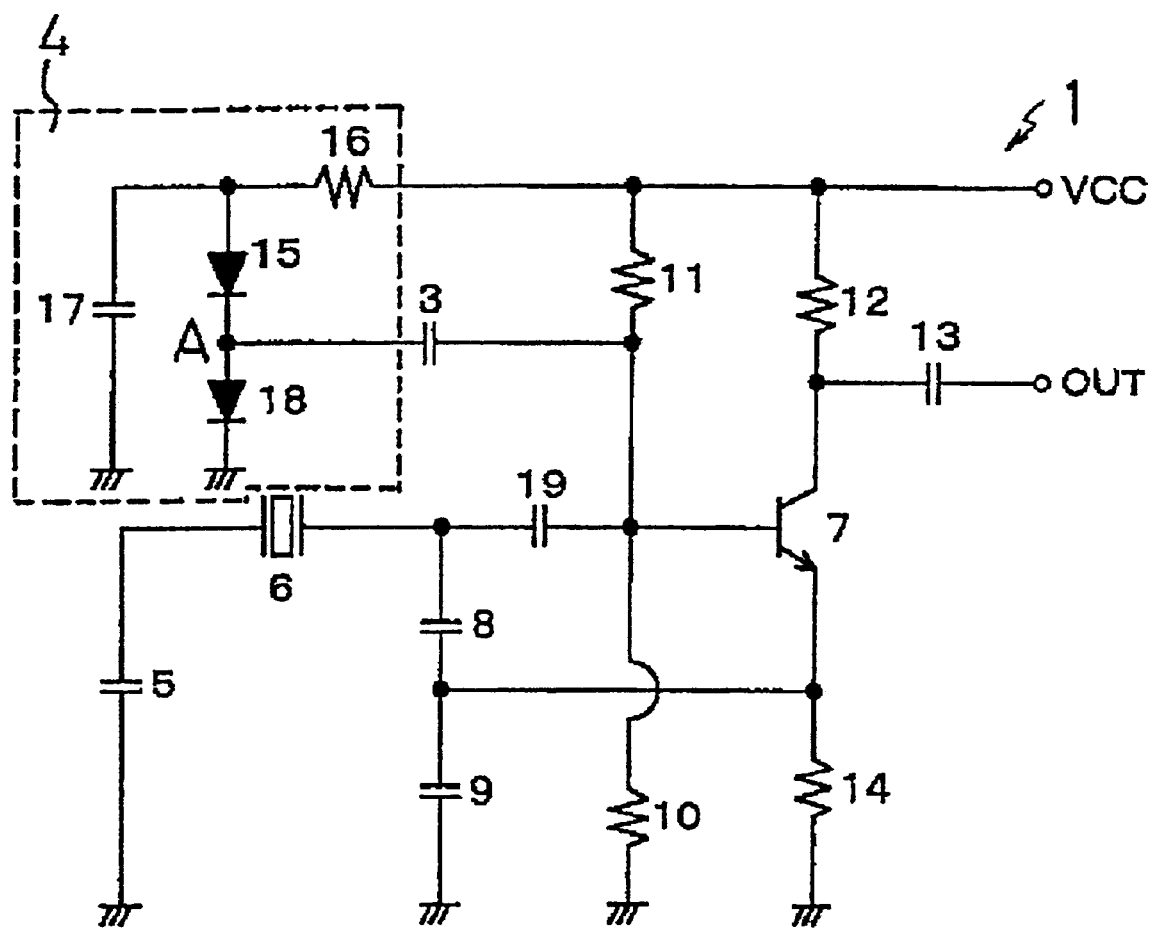
FIG. 3 is a circuit diagram of another embodiment of a crystal oscillator according to the present invention.
Figure 4:
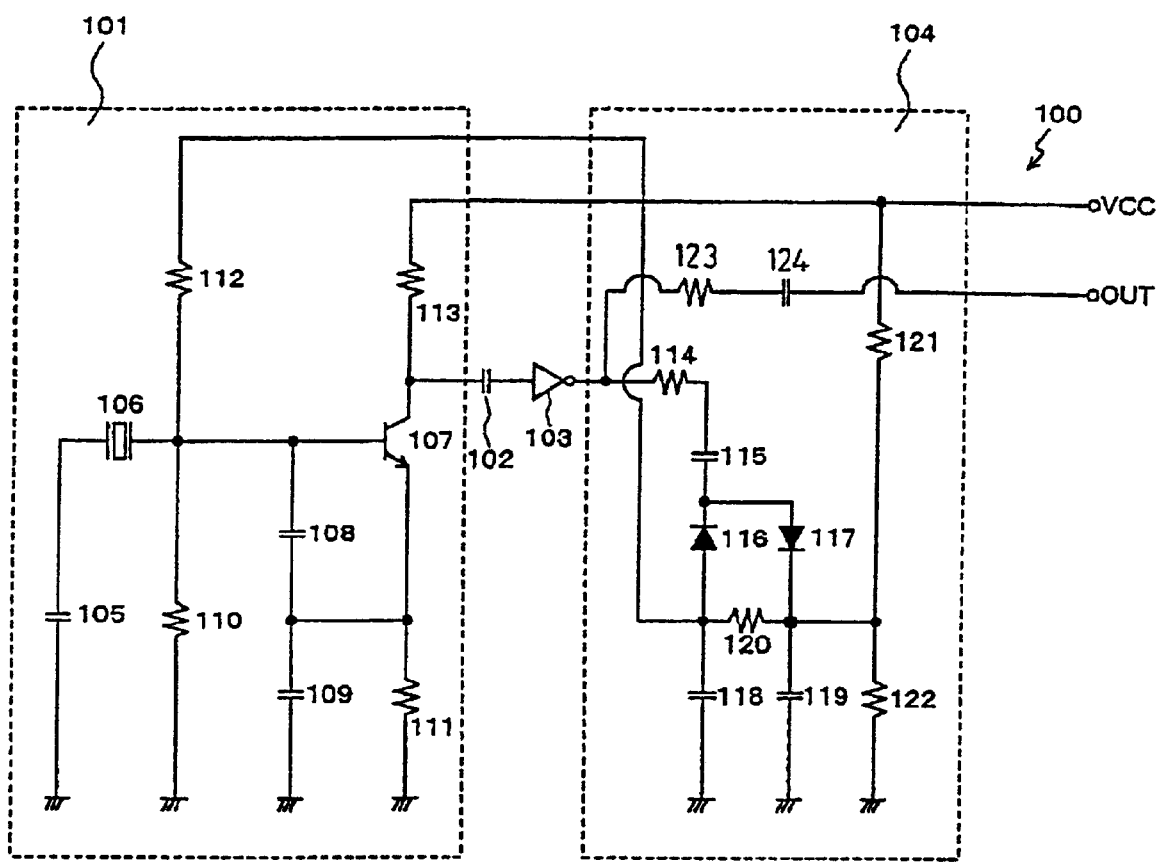
FIG. 4 is a circuit diagram of a conventional crystal oscillator.

Moreover, although the present invention has been described in conjunction with a configuration, in which one end of capacitor 9 is connected to limiter circuit 4, the present invention is not limited to this configuration; a circuit configuration such as that shown in FIG. 3 may be used.

Another embodiment of a crystal oscillator according to the present invention will be explained with reference to FIG. 3.

The illustrated crystal oscillator 1 is characterized in that the limiter circuit 4 is connected to the base of the oscillating transistor 6 via the capacitor 3.

Even in this configuration, the above-described limiter 4 is able to control the level of the excitation signal from crystal vibrator 6 so as to be stable at a desired value.

That is, a voltage VA+VB corresponding to the superposition of a voltage VB (a peak value for a half cycle) of an excitation signal supplied from an oscillation loop via the capacitor 3, on a DC current VA based on the power supply voltage Vcc is generated at connection midpoint A.

In this case, the value for resistor 16 is properly determined so that the synthesized voltage of VA and VB is less than 0.7V.

In this state, if the level of the excitation signal increases by ΔV, the impedance between one end of crystal vibrator 6 and the ground decreases linearly with the impedance of diodes 15 and 18 decreasing, thereby clipping the level of the excitation signal, as in the crystal oscillator shown in FIG. 1.

Consequently, if the circuit is configured so that the level of the lowest excitation signal from the crystal oscillator 1 is VB and the synthesized voltage of VA and VB is. 0.7V, crystal oscillator 1 always oscillates at the lowest oscillation level, restraining the activation stress to provide excellent aging characteristics.

Although the present invention has been described in conjunction with a crystal oscillator as an illustrative case, it is not limited to this combination, but may be used with any piezoelectric oscillator that uses a piezoelectric vibrating element.

The crystal oscillator according to the present invention uses the characteristics of the diode to control the amplification of the transistor of the oscillation circuit, so that the optimal excitation level can be adjusted only by means of the value for the resistor 16 of the limiter circuit, thereby enables an efficient production.

As described above, the cr oscillator according to the present invention comprises a Colpitts circuit including a piezoelectic vibrator and a load capacitance comprising at least a capacitor in the oscillating loop, and a limiter circuit wherein an excitation signal from the piezoelectric vibrator is supplied to the limiter circuit. Based on variations in excitation signal, the limiter circuit controls an inter-terminal impedance of said capacitor which is connected to said limiter and thus clips the level of the excitation signal.

What is claimed is:

1. A piezoelectric oscillator comprising a Colpitts circuit including a piezoelectric vibrator and a load capacitance comprising at least one capacitor in the oscillating loop, and a limiter circuit in which the impedance decreases by an increase of the current or a rise of the voltage supplied to said limiter circuit, wherein an excitation signal from said piezoelectric vibrator is supplied to said limiter circuit and one end of said capacitor is connected to obtain an alternate current, and the limiter circuit controls an inter-terminal impedance of said capacitor which is connected to said limiter circuit and thus clips the level of the excitation signal in response to variations in said excitation signal.

2. A piezoelectric oscillator comprising a oscillation circuit including a piezoelectric vibrator and a load capacitor in the oscillating loop, and a limiter circuit in which the impedance decreases by an increase of the current or a rise of the voltage, wherein an excitation signal from said piezoelectic vibrator is supplied to said limiter circuit and one end of said load capacitor is connected to obtain an alternate current, the limiter circuit controls an inter-terminal impedance of said load capacitor which is connected to said limiter circuit and thus clips the level of the excitation signal in response to variations in said excitation signal, and said limiter circuit comprises a series circuit comprising two diodes connected in series so that a forward current flows from a power supply toward a ground, and a capacitor connected in parallel with the series circuit, with a connection midpoint between said two diodes connected to one end of said load capacitor.

3. The piezoelectic oscilator according to claim 1 or 2, wherein said at least a capacitor is inserted and connected between said piezoelectric vibrator and the ground, said load capacitance includes first and second capacitors connected in series, wherein said limiter circuit comprises said two diodes connected in series so that a forward current flows from a power supply toward a ground, and a third capacitor connected in parallel with the series connected two diodes, and wherein a connection midpoint between the said first and second capacitors and a connection midpoint between said two diodes are connected via a fourth capacitor.

4. The piezoelectric oscillator according to claim 1 or 2 comprising a transistor circuit having a resistance element connected to an appropriately biased emitter, said piezoelectric vibrator is inserted between a base and a ground of the transistor circuit, and first and second capacitors, said first capacitor being conned between the base and emitter of the transistor, and the second capacitor being connected in parallel with said emitter-resistor; wherein a resistor of a desired value and said two diodes are inserted in series between a power supply and the ground, the limiter circuit includes a third capacitor for earthing the diode series circuit toward a high frequency, and these two diode connection points and the emitter of the transistor are connected to obtain an alternate current.

5. The piezoelectric oscillator according to claim 3 wherein said oscillator comprises a Colpitts circuit comprising a transistor circuit having a resistance element connected to an appropriately biased emitter, said piezoelectric vibrator is inserted between a base and a ground of the transistor circuit, and said first capacitor being connected between the base and emitter of the transistor and the second capacitor being connected in parallel with said emitter resistor, and the limiter circuit further includes a fifth capacitor for earthing the two series connected diodes toward a high frequency, and these two diode connection points and the emitter of the transistor are connected to obtain an alternate current.

6. A piezoelectic oscillator according to claim 1, wherein said load capacitance comprises first and second capacitors inserted in series between one end of said piezoelectric vibrator connected to a base of a transistor amplifier and the ground, and a connection midpoint between said first and second capacitor and said limiter circuit are connected.

7. A piezoelectric oscillator according to claim 1 or 6, wherein a resistor of a desired value and two diodes are inserted in series between a power supply and the ground in said limiter circuit, and said limiter circuit includes a capacitor for earthing the diode series circuit toward a high frequency.

8. A piezoelectric oscillator according to claim 1, wherein one end of said capacitor and said limiter circuit are connected via a capacitor.

9. A piezoelectric oscillator according to claim 6, wherein a connection midpoint between said first and second capacitor and said limiter circuit are connected via a capacitor.

10. A piezoelectric oscillator according to claim 7, wherein a connection midpoint between said first and second capacitor and a connection midpoint between said two diodes are connected via a capacitor.

11. A piezoelectric oscillator according to claim 5, wherein a connection midpoint between a base of said transistor amplifier and said piezoelectric vibrator and said limiter circuit are connected.

12. A piezoelectric oscillator according to claim 11, wherein a resistor of a desired value and two diodes are inserted in series between a power supply and the ground in said limiter circuit, and said limiter circuit includes a capacitor for earthing the diode series circuit toward a high frequency.

13. A piezoelectric oscillator according to claim 11, wherein a connection midpoint between a base of said transistor amplifier and said piezoelectric vibrator and said limiter circuit are connected via a capacitor.

14. A piezoelectric oscillator according to claim 12, wherein a connection midpoint between a base of said transistor amplifier and said piezoelectric vibrator and a connection midpoint between said two diodes said are connected via a capacitor.

* * * * *